United States Patent
Schidl et al.

(10) Patent No.: US 12,323,280 B2
(45) Date of Patent: Jun. 3, 2025

(54) METHOD FOR CALIBRATING AN SSB RECEIVER

(71) Applicant: Kapsch TrafficCom AG, Vienna (AT)

(72) Inventors: Stefan Schidl, Vienna (AT); Markus Krapfenbauer, Vienna (AT)

(73) Assignee: Kapsch TrafficCom AG, Vienna (AT)

( * ) Notice: Subject to any disclaimer, the term of this patent is extended or adjusted under 35 U.S.C. 154(b) by 106 days.

(21) Appl. No.: 18/337,608

(22) Filed: Jun. 20, 2023

(65) Prior Publication Data

US 2023/0421426 A1 Dec. 28, 2023

(30) Foreign Application Priority Data

Jun. 24, 2022 (EP) ..................................... 22180923

(51) Int. Cl.
*H04L 27/06* (2006.01)
*H04B 1/30* (2006.01)

(52) U.S. Cl.
CPC ............ *H04L 27/06* (2013.01); *H04B 1/302* (2013.01)

(58) Field of Classification Search
CPC .......... H04L 27/06; H04B 1/302; H03D 1/24; H03D 3/007; H03D 3/009
See application file for complete search history.

(56) References Cited

U.S. PATENT DOCUMENTS

| | | | |
|---|---|---|---|
| 6,714,776 B1 | 3/2004 | Birleson | |
| 8,064,863 B1 * | 11/2011 | Reed | H04B 1/30 455/67.11 |
| 8,811,538 B1 * | 8/2014 | Manku | H03D 3/009 375/322 |
| 9,059,879 B2 * | 6/2015 | Jaeger | H04B 17/29 |
| 2002/0055347 A1 | 5/2002 | Spargo et al. | |
| 2006/0281411 A1 | 12/2006 | Isaac et al. | |
| 2011/0182388 A1 | 7/2011 | Kim et al. | |

OTHER PUBLICATIONS

Extended European Search Report received for European Patent Application No. 22180923.9, mailed on Dec. 12, 2022, 7 pages.

* cited by examiner

*Primary Examiner* — Betsy Deppe
(74) *Attorney, Agent, or Firm* — Weaver IP L.L.C.

(57) ABSTRACT

A method for calibrating a single sideband (SSB) receiver, comprising: a) adjusting a mutual phase shift of I- and Q-signals to a first phase shift value; b) feeding a first, a second and a third test signal having a predetermined phase offset to an input to obtain respective SSB signals, and measuring a first and a second phase difference therefrom; c) calculating a first phase error on the basis of the first and second phase differences; d) repeating steps a)-c) with a second phase shift value to obtain a second phase error; and e) calibrating the SSB receiver by using that one of the first and second phase shift values that has yielded the smaller one of the first and second phase errors.

14 Claims, 2 Drawing Sheets

METHOD FOR CALIBRATING AN SSB RECEIVER

CROSS-REFERENCE TO RELATED APPLICATIONS

This application claims priority to European Patent Application No. 22 180 923.9 filed Jun. 24, 2022, the disclosure of which is incorporated herein by reference.

TECHNICAL FIELD

The present disclosed subject matter relates to a method for calibrating a single sideband (SSB) receiver.

BACKGROUND

In typical SSB communications, an SSB transmitter sends a signal with frequency components in one sideband only to reduce power and bandwidth required for signal transmission. The sent signal is received and processed to a baseband SSB signal by the SSB receiver. To this end the SSB receiver has an input for receiving the signal, an I/Q mixer for converting the signal into an I- and a Q-signal, a phase shifter for mutually phase shifting the I- and Q-signals by 90° and a combiner for combining the I- and Q-signals to an SSB signal. In this receiver structure, an unwanted sideband (the "image signal"), e.g., originating from an imperfect SSB transmitter, superposes and impedes the SSB signal and should, thus, ideally be cancelled after phase shifting and combining the I- and Q-signals.

However, due to residual misalignments of the I- and Q-signals, e.g., caused by component aging or temperature, most often a residual image signal remains and impedes the SSB signal also in the single sideband of interest by distorting phases and amplitudes of its frequency components. The level of the residual image signal impacts the received SSB signal and, consequently, the accuracy of the application, wherefore a proper receiver calibration is crucial.

In road tolling applications, for instance, road-sided localisation transceivers comprise an array of SSB receivers and localise a passing vehicle carrying an on-board unit (OBU) via SSB communications between the array and the OBU. To localise the vehicle, a phase of a received SSB signal is measured at a target frequency by each SSB receiver of the array, and an angle of arrival of the SSB signal and the position of the OBU is determined from differences of the measured phases. Any residual image signals arising in the SSB receivers result in an incorrect measurement of the phase of each received SSB signal, in incorrect phase differences and, hence, in an incorrect localisation of the vehicle. Consequently, a receiver calibration which achieves an efficient image cancellation is desirable to correctly localise vehicles, e.g., in tolling or lane control applications.

A variety of calibration methods for cancelling the image signal in an SSB receiver are known in the art, see, e.g., US 2002/0055347 A1, U.S. Pat. No. 6,714,776 B1 and US 2011/0182388 A1. However, current receiver calibrations still suffer from a too high residual image signal distorting the received SSB signal and/or a high complexity necessitating expensive hardware.

BRIEF SUMMARY

It is an object of the present disclosed subject matter to provide a method for calibrating an SSB receiver which overcomes the drawbacks of the state of the art and which is both efficient in image signal cancellation and easy to implement.

This object is achieved by a method for calibrating an SSB receiver having an input for receiving a signal, an I/Q mixer for converting the signal into an I-signal in an inphase path and a Q-signal in a quadrature path, a phase shifter for mutually phase shifting the I- and Q-signals by an adjustable phase shift, and a combiner for combining the mutually phase shifted I- and Q-signals to an SSB signal, the method comprising:

a) adjusting the phase shift to a first phase shift value;
b) successively feeding a first, a second and a third test signal to the input, the first and second test signals having a predetermined phase offset and the second and third test signals having the same predetermined phase offset, to obtain respective first, second and third SSB signals, and measuring a first phase difference between the first and second SSB signals and a second phase difference between the second and third SSB signals;
c) calculating a first phase error on the basis of the first and second phase differences;
d) repeating steps a)-c) with a second phase shift value in step a) to obtain a second phase error; and
e) calibrating the SSB receiver by using that one of the first and second phase shift values that has yielded the smaller one of the first and second phase errors.

The inventive calibration method is based on adjusting an adjustable phase shift in the phase shifter in order to minimise an asymmetry of measured phase differences between three (the first, second and third) SSB signals originating from three (the first, second and third) test signals which have been generated with predetermined symmetric phase offsets around a phase of the second test signal. As the asymmetry of the measured phase differences indicates the strength of the unwanted residual image signal, a minimisation of the phase error calculated from the measured phase differences minimises the residual image signal and allows for an accurate image signal cancellation in the combiner. By repeatedly carrying out steps a) to c) for each of the two (optionally for more than two) phase shift values, that phase shift value which minimises the calculated phase error and, hence, the image signal strength, can be found and used for subsequent signal reception in the then calibrated SSB receiver.

Both the generation of the symmetrically phase shifted test signals as well as the detection of the phase difference asymmetricity of the resulting SSB signals are easy to implement and quick to execute. Therefore, simple and inexpensive hardware can be used, on the one hand, and a large number of (even more than two) phase shift values can be quickly set and evaluated by repeating steps a) to c) to find a (global) minimum of the phase error and the residual image signal strength. Hence, a large set of eligible phase shift values may be scanned, e.g., in a brute-force manner or by any optimisation algorithm known in the art.

The phase errors can be calculated according to a variety of functions depending on the first and second phase differences. In one embodiment, the first and second phase errors are calculated each as $$E_{\varphi,j} = |\Delta\varphi_{12} - \Delta\varphi_{23}| \quad (1)$$

with
$E_{\varphi,j}$ corresponding to the respective first (j=1) and second (j=2) phase error,
$\Delta\varphi_{12}$, $\Delta\varphi_{23}$ corresponding to the first and second phase differences, respectively, and
$|\cdot|$ denoting the absolute value.

Such a phase error calculation is particularly easy to implement and fast in execution such that the phase error minimisation and the calibration can be carried out quickly.

The predetermined phase offset determines the range of phases spanned by the first, second and third test signals. In a further embodiment the predetermined phase offset is in the range of 10° to 80°, in particular in the range of 25° to 65°, e.g., approximately 45°. Choosing the phase offset from these ranges results in a calculated phase error which is a good indication of the strength of the image signal and, hence, the quality of image cancellation. As a result of calibrating the SSB receiver with such a phase offset, a high quality SSB signal can be obtained and particularly accurate phases and/or amplitudes can be measured therefrom.

In an advantageous embodiment, the phase shifter comprises, in one of the inphase and quadrature paths, a filter with at least one variable capacitor or inductor. Such a filter—which may be a high pass, a low pass or a band pass filter—can filter out unwanted (out of band) frequencies and, at the same time, phase shift one of the I- and Q-signals by a phase shift value depending on the state of the variable capacitor or inductor.

In a favourable variant of this embodiment, the filter comprises a capacitor bank having parallel capacitors that can be selectively connected to said one path to adjust the phase shift. The capacitor bank provides a variable capacitance which can be fast, easily and accurately controlled by connecting any desired subset of parallel capacitors to said path. The selective connection of each capacitor can be simply realised by a switch, e.g., an analogue switch such as an NMOS switch, which allows to implement the variable capacitor on an integrated circuit. The switches may be remotely controlled such that a calibration of the SSB receiver does not require the presence of a support technician. When the capacitances of the capacitors of said capacitor bank additionally form a geometric sequence with a common ratio of two, the capacitance of the capacitor bank can be adjusted in quantised steps of the smallest capacitance of the parallel capacitors to adjust the phase shift particularly accurately.

In addition to the filter in the inphase or quadrature path, the phase shifter can comprise another filter in the other one of said paths to filter (and optionally phase shift) the other one of the I- and Q-signals. With this 2-filter setup of the phase shifter, unwanted frequencies can be removed from the SSB signal such that its phases and/or amplitudes at respective target frequencies can be measured particularly precisely.

In a favourable embodiment, the SSB receiver further comprises an amplitude adjuster for mutually adjusting the amplitudes of the I- and Q-signals by an adjustable amplitude gain, and in step a)—and its repetition in step d)—also the amplitude gain is adjusted to first and second amplitude gain values, respectively, wherein in step e) the SSB receiver is calibrated by using that combination of first phase shift and amplitude gain values and second phase shift and amplitude gain values that has yielded the smaller one of the first and second phase errors. Thereby, the I- and Q-signals can be tuned more precisely to cancel the image signal at the subsequent combiner.

It is beneficial when the amplitude adjuster comprises a resistor bank having parallel resistors that can be selectively connected to one of the inphase and quadrature paths to adjust the amplitude gain. Similar to the capacitor bank, the resistor bank provides a variable resistance which can be fast, easily and accurately controlled by connecting a desired selection of the parallel resistors via switches. Optionally, when resistances of the resistors of said resistor bank form a geometric sequence with a common ratio of two, the conductance (the inverse of the resistance) of the resistor bank can be set in steps of the smallest conductance of the parallel resistors to adjust the amplitude gain particularly accurately. Moreover, when the resistor bank has a respective capacitor in series to each selectively connectable resistor, a direct current component of the I- and Q-signals can be suppressed. This is particularly useful when the I- and Q-signals are converted to an intermediate frequency band to ease a further conversion of the received SSB signal to baseband in the combiner.

While the test signals can in principle be any phase shifted signals, in a further embodiment the test signals are generated by amplitude modulation. This allows calibrating the SSB receiver at one or more target frequencies included in the amplitude signal used for amplitude modulation.

BRIEF DESCRIPTION OF THE DRAWINGS/FIGURES

The disclosed subject matter shall now be described in further detail by means of exemplary embodiments thereof under reference to the enclosed drawings, in which.

DETAILED DESCRIPTION

Figure 1:
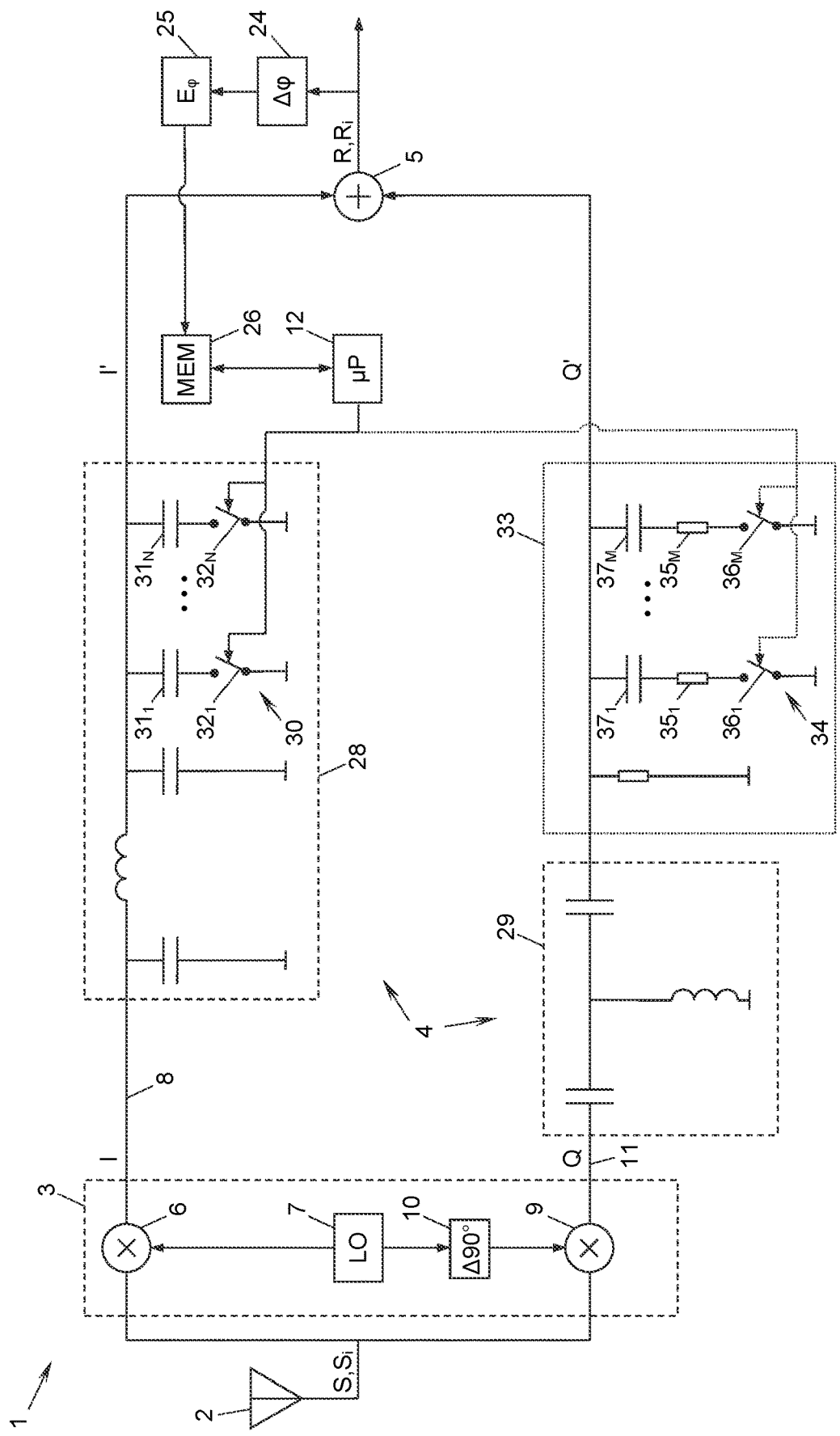
FIG. 1 shows an SSB receiver in a schematic block diagram.

FIG. 1 shows a single sideband (SSB) receiver 1 receiving a signal S at an input 2 and processing the signal S by an I/Q mixer 3, a phase shifter 4 and a combiner 5 to obtain an SSB signal R therefrom. The I/Q mixer 3 has a first mixer 6 connected to a local oscillator 7 for converting the signal S into an I-signal I in an inphase path 8 and a second mixer 9 connected to the local oscillator 7 via a 90° phase delay element 10 for converting the signal S into a Q-signal Q in a quadrature path 11. Depending on the frequency of the local oscillator 7, the I- and Q-signals I, Q can reside either in intermediate band frequencies or in baseband.

The phase shifter 4 is arranged downstream of the I/Q mixer 3 and mutually phase shifts the I- and Q-signals I, Q by an adjustable phase shift $\Delta\Theta$ whose determination will be described below. The combiner 5 is arranged downstream of the phase shifter 4 and combines the mutually phase shifted I- and Q-signals I', Q' to the SSB signal R, e.g., by adding or subtracting these signals I', Q' to/from one another, to cancel any unwanted sideband ("image signal") in the SSB signal R.

The phase shift $\Delta\Theta$ affects the cancellation of the image signal and is to be properly adjusted by calibrating the SSB receiver 1. A method M for calibrating the SSB receiver 1 shall now be described with reference to FIGS. 1 and 2.

In a first step a) of the method M, the phase shift $\Delta\Theta$ is adjusted to a first phase shift value $\Delta\Theta_1$. Typically, the first phase shift value $\Delta\Theta$ is adjusted to approximately cause 180° dephased I- and Q-signals I, Q. In the embodiment shown in FIG. 1 the SSB receiver 1 has a controller 12 which adjusts the phase shift $\Delta\Theta$ as described later on in more detail.

In a second step b) of the method M a first, a second and a third test signal $S_1$, $S_2$, $S_3$, generally $S_i$ (i=1, 2, 3), are fed to the input 2 to obtain—after receiving, I/Q mixing, phase shifting and combining each of the test signals $S_i$ in the SSB receiver 1—respective first, second and third SSB signals $R_1$, $R_2$, $R_3$, generally $R_i$ (i=1, 2, 3), therefrom. The first test signal $S_1$ and the second test signal $S_2$ have a predetermined phase offset $\Delta\Phi_{12}$, and the second test signal $S_2$ and the third test signal $S_3$ have the same predetermined phase offset $\Delta\Phi_{23}=\Delta\Phi_{12}=\Delta\Phi$. Thus, the phase of the second test signal $S_2$ is centred and separated from the phase of the first test signal $S_1$ and the phase of the third test signal $S_3$ by the absolute value of the phase offset $\Delta\Phi$.

Figure 3:
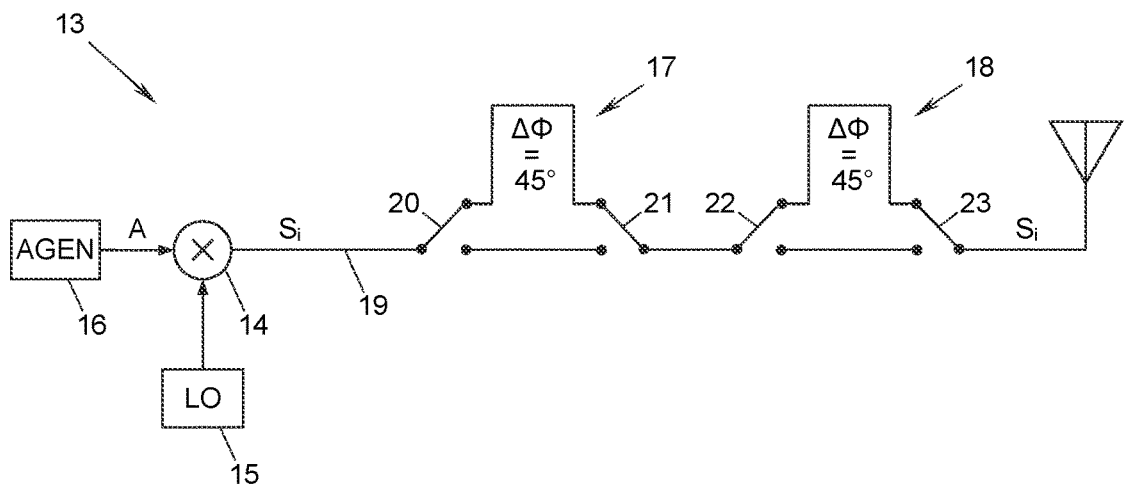
FIG. 3 shows a test signal generator generating and feeding test signals according to the method of FIG. 2 into the SSB receiver of FIG. 1 in a schematic block diagram.

The test signals $S_i$ may be generated by a variety of modulation techniques known in the art. An exemplary test signal generator 13 to generate the test signals $S_i$ is shown in FIG. 3. The test signal generator 13 has a mixer 14 modulating the signal of a local oscillator by an amplitude signal A of an amplitude generator 16 to generate each test signal $S_i$ by amplitude modulation. For instance, the amplitude generator 16 can generate the amplitude signal A to oscillate at a single target frequency which eases a successive phase measurement described below. The test signal generator 13 further has two 45° phase delay lines 17, 18 each of which can be selectively connected to the signal path 19 of the amplitude-modulated test signal $S_i$ via switches 20-23, to generate the first, second and third test signals $S_i$ having a predetermined phase offset $\Delta\Phi$ of 45°. Alternatively, the predetermined phase offset $\Delta\Phi$ may have a different value, e.g., in the range of 10° to 80°, or in the range of 25° to 65°.

Figure 2:
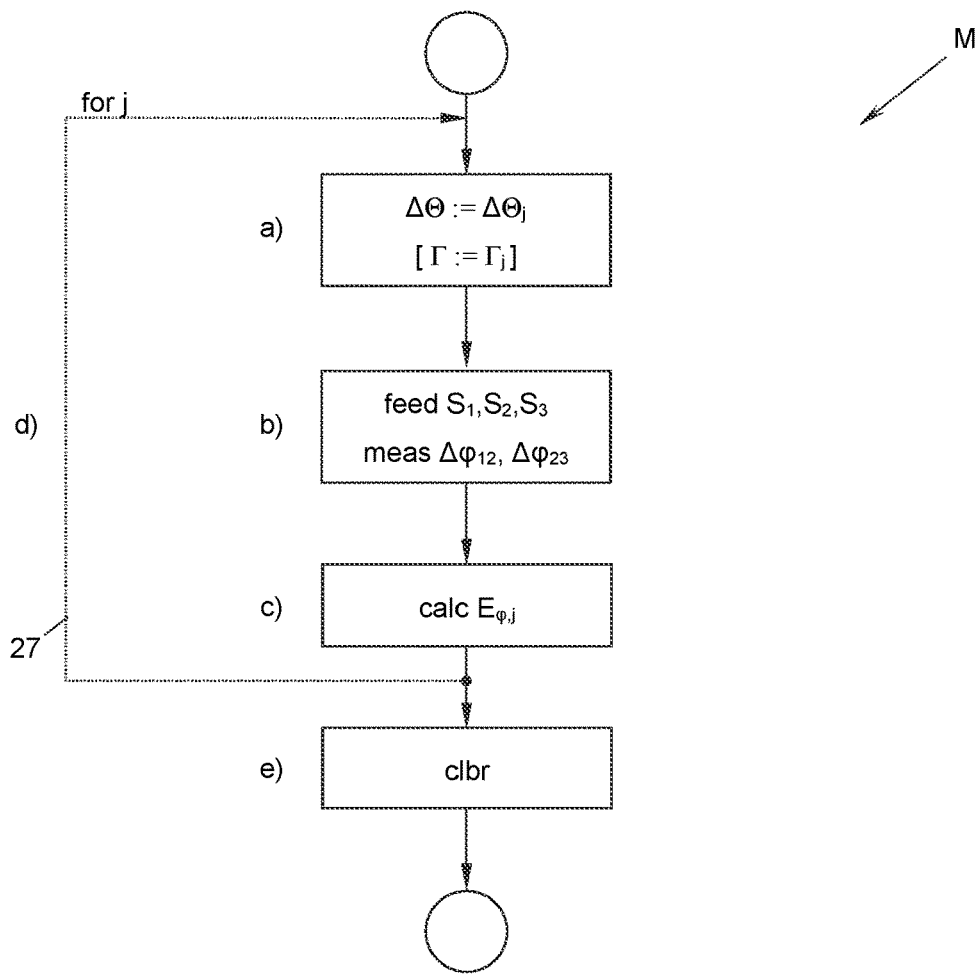
FIG. 2 shows a method according to the disclosed subject matter for calibrating the SSB receiver of FIG. 1 in a flow diagram.

Coming back to FIG. 2, step b) of the method M further comprises measuring a first phase difference $\Delta\varphi_{12}$ between the first SSB signal $R_1$ and the second SSB signal $R_2$ and measuring a second phase difference $\Delta\varphi_{23}$ between the second SSB signal $R_2$ and the third SSB signal $R_3$. The difference between the first and second phase differences $\Delta\varphi_{12}$, $\Delta\varphi_{23}$ corresponds to an asymmetry in the phase measurement and is indicative of a residual image signal. The method M is based on utilising the degree of asymmetry of the first and second phase differences $\Delta\varphi_{12}$, $\Delta\varphi_{23}$ at a selected phase shift $\Delta\Phi$ to enhance image cancellation.

In the SSB receiver 1 of FIG. 1, the phase differences $\Delta\varphi_{12}$, $\Delta\varphi_{23}$ are measured in an analogue or digital phase measuring circuit 24. For instance, the phase measuring circuit 24 may measure the phase of each SSB signal e.g., by comparing zero crossings of each SSB signal $R_i$ with zero crossings of a local oscillator, which oscillates at the same target frequency of amplitude modulation mentioned above, and subsequently subtract the measured phases from each other.

It shall be noted that the feeding and measuring of step b) may be performed in several temporal orders: in a first exemplary variant by successively feeding all three test signals $S_i$ into the input 2 one after the other while measuring the respective phases $\varphi_i$ of the SSB signals $R_i$ and then computing the phase differences $\Delta\varphi_{12}$, $\Delta\varphi_{23}$ therefrom; or in a second exemplary variant by successively feeding two of the three test signals $S_i$, e.g., the first and the second test signals $S_1$, $S_2$, while measuring the phases $\varphi_1$ and $\varphi_2$ and computing their phase difference $\Delta\varphi_{12}$ and then feeding other two of the three test signals $S_i$, e.g., the second and the third test signals $S_2$, $S_3$, while measuring the phases $\varphi_2$ and $\varphi_3$ and computing their phase difference $\Delta\varphi_{23}$.

In a subsequent step c) of the method M a first phase error $E_{\varphi,1}$ is calculated on the basis of the first and second phase differences $\Delta\varphi_{12}$, $\Delta\varphi_{23}$ measured in step b). To this end, a variety of mathematical functions depending on the phase differences $\Delta\varphi_{12}$, $\Delta\varphi_{23}$ can be used, e.g., In a subsequent step c) of the method M, a first phase error $E_{\varphi,1}$ is calculated on the basis of the first and second phase differences $\Delta\varphi_{12}$, $\Delta\varphi_{23}$ measured in step b). To this end, a variety of mathematical functions depending on the phase differences $\Delta\varphi_{12}$, $\Delta\varphi_{23}$ can be used, e.g., $$E_{\varphi,1}=|\Delta\varphi_{12}-\Delta\varphi_{23}|, \quad (1)$$

$$E_{\varphi,1}=\max(\Delta\varphi_{12}/\Delta\varphi_{23},\Delta\varphi_{23}/\Delta\varphi_{12}), \quad (2)$$

$$E_{\varphi,1}=|\Delta\varphi_{12}+\Delta\varphi_{23}-2\cdot\Delta\Phi|, \text{ etc.} \quad (3)$$

with
$E_{\varphi,1}$ denoting the first phase error,
$|\cdot|$ denoting the absolute value, and
$\max(\cdot)$ denoting the maximum.

In the SSB receiver 1 of FIG. 1, the first phase error $E_{\varphi,1}$ is calculated in an error calculation unit 25 and subsequently stored in a memory 26 together with the first phase shift value $\Delta\Theta_1$.

In a subsequent step d) of the method M, steps a)-c) are repeated in a loop 27 at least once, i.e. in the first repetition, a second phase shift value $\Delta\Theta_2$ is set in step a), to obtain a second phase error $E_{\varphi,2}$ at the end of step c). In other words, within the first repetition of the loop 27, in step a) the phase shift $\Delta\Theta$ is adjusted to a second phase shift value $\Delta\Theta_2$ different from the first phase shift value $\Delta\Theta_1$; with this adjustment the test signals $S_i$ are successively fed into the input 2 and the resulting phase differences $\Delta\varphi_{12}$, $\Delta\varphi_{23}$ of the then obtained (and differently phase shifted) SSB signals $R_i$ are measured in step b); and from the new phase differences $\Delta\varphi_{12}$, $\Delta\varphi_{23}$ a second phase error $E_{\varphi,2}$ is calculated in step c). The phase shift values $\Delta\Theta_2$ may be stored together with the second phase error $E_{\varphi,2}$ in the memory 26.

In a final step e), the SSB receiver 1 is calibrated by using that one of the first and second phase shift values $\Delta\Theta_1$, $\Delta\Theta_2$ that has yielded the smaller one of the first and second phase errors $E_{\varphi,1}$, $E_{\varphi,2}$, i.e. by using the first phase shift value $\Delta\Theta_1$ in case the first phase error $E_{\varphi,1}$ is smaller than the second phase error $E_{\varphi,2}$ and the second phase shift value $\Delta\Theta_2$ otherwise. To this end, the smallest phase error $E_{\varphi,1}$ or $E_{\varphi,2}$ and the corresponding phase shift value $\Delta\Theta_1$ or $\Delta\Theta_2$ can be retrieved from the memory 26 and used by the controller 12.

After carrying out steps a) to e), the SSB receiver 1 is roughly calibrated and ready to receive further signals S at a higher quality, i.e. with a lower residual image signal.

As indicated by the loop 27 in FIG. 2, the steps a)-c) may—and typically will—be repeated more than once for multiple phase shift values $\Delta\Theta_j$ (j=1, 2, 3, 4, . . . ), to obtain respective multiple phase errors $E_{\varphi,j}$ and store them together with the phase shift values $\Delta\Theta_j$ in the memory 26 so that the best phase shift value $\Delta\Theta_j$, which yielded the smallest phase error $E_{\varphi,j}$, can be retrieved from the memory 26 and used by the controller 12 in step e). Of course, to find a phase shift value $\Delta\Theta_j$ that yields a minimum phase error $E_{\varphi,j}$ any optimisation algorithms known in the art may be employed by the controller 12.

Alternatively, e.g., in case of a small number of possible phase shift vales $\Delta\Theta_j$, all possible phase shift vales $\Delta\Theta_j$ may be employed one after the other in a brute-force manner to find a minimal phase error $E_{\varphi,j}$.

FIG. 1 shows an exemplary embodiment of the phase shifter 4 which shall now be described in more detail. The phase shifter 4 of this embodiment comprises a first filter 28 (here: a low pass filter) in the inphase path 8 and a second filter 29 (here: a high pass filter) in the quadrature path 11.

The first filter 28 has a variable capacitor formed by a capacitor bank 30 which has parallel capacitors $31_1$, $31_2$, ... $31_N$, generally $31_n$, that can be selectively connected to the inphase path 8 via respective switches $32_1$, $32_2$, ... $32_N$, generally $32_n$. The switches $32_n$ are controlled by the controller 12 which thereby adjusts the phase shift $\Delta\Theta$ to the respective phase shift value $\Delta\Theta_j$. In order to fine-tune the adjustment of the phase shift $\Delta\Theta$ the capacitors $31_n$ of the capacitor bank 30 optionally form a geometric series with a common ratio of two, i.e. the capacitance of the n-th capacitor $31_n$ is given by $C_n = C_1 \cdot 2^{n-1}$ with $C_1$ and $C_n$ denoting the capacitance of the first and n-th capacitors $31_1$, $31_n$ of the capacitor bank 30, respectively.

In other embodiments (not shown) the SSB receiver 1 can comprise low, high and bandpass filters in the inphase and/or quadrature paths 8, 11 each with or without a variable capacitor and/or inductor to filter and phase shift the I- and Q-signals I, Q.

Moreover, as shown in FIG. 1 the SSB receiver 1 can optionally comprise an amplitude adjuster 33 which mutually adjusts the amplitudes of the I- and Q-signals I, Q by an adjustable amplitude gain $\Gamma$. The amplitude adjuster 33 can be controlled by the controller 12 such that besides the phase shift $\Delta\Theta$ also the amplitude gain $\Gamma$ is adjusted (in step a) to a first amplitude gain value $\Gamma_1$, and in one or more repetition/s in the loop 27 of step d) to a respective second (optionally: third, fourth, ...) amplitude gain value $\Gamma_2$ ($\Gamma_3$, $\Gamma_4$, ...). The phase shift values $\Delta\Theta_j$, the amplitude gain values $\Gamma_j$ and the resulting phase errors $E_{\varphi,j}$ can be stored in the memory 26 and employed to find that combination of phase shift and amplitude gain values $\Delta\Theta_j$, $\Gamma_j$ that has yielded the smallest one of the phase errors $E_{\varphi,j}$. This combination may then be used to calibrate the SSB receiver 1 therewith in step e).

As can be seen in FIG. 1, the optional amplitude adjuster 33 can have a structure similar to the capacitor bank 30 and comprise a resistor bank 34 which has parallel resistors $35_1$, $35_2$, ... $35_M$, generally $35_m$, that can be selectively connected to the quadrature path 11 via respective switches $36_1$, $36_2$, ... $36_M$, generally $36_m$. The switches $36_m$ are controlled by the controller 12 which thereby adjusts the amplitude gain $\Gamma$ to the respective amplitude gain value $\Gamma_j$. In order to fine-tune the adjustment of the amplitude gain $\Gamma$ the resistors $35_m$ of the resistor bank 34 optionally form a geometric series with a common ratio of two, i.e. the resistance of the m-th resistor $35_m$ is given by $W_m = W_1 \cdot 2^{n-1}$, with $W_1$ and $W_m$ denoting the resistance of the first and m-th resistors $35_1$, $35_m$ of the resistor bank 34, respectively. Moreover, to additionally suppress DC components in the Q-signal Q, the resistor bank 34 further has a respective capacitor $37_1$, $37_2$, ..., $37_M$ in series to each selectively connected resistor $35_m$.

While the optional amplitude adjuster 33 is arranged in the quadrature path 11 only and attenuates the Q-signal Q in the embodiment shown in FIG. 1, more generally the mutual amplitude adjustment can be carried out by attenuating or amplifying one or both of the I- and Q-signals.

The present disclosed subject matter is not restricted to the specific embodiments described in detail herein, but encompasses all variants, combinations and modifications thereof that fall within the scope of the appended claims.

What is claimed is:

1. A method for calibrating a single sideband (SSB) receiver having an input for receiving a signal, an I/Q mixer for converting the signal into an I-signal in an inphase path and a Q-signal in a quadrature path, a phase shifter for mutually phase shifting the I- and Q-signals by an adjustable phase shift, and a combiner for combining the mutually phase shifted I- and Q-signals to an SSB signal, the method comprising:
   a) adjusting the phase shift to a first phase shift value;
   b) successively feeding a first, a second and a third test signal to the input, the first and second test signals having a predetermined phase offset and the second and third test signals having the same predetermined phase offset, to obtain respective first, second and third SSB signals, and measuring a first phase difference between the first and second SSB signals and a second phase difference between the second and third SSB signals;
   c) calculating a first phase error on the basis of the first and second phase differences;
   d) repeating steps a)-c) with a second phase shift value in step a) to obtain a second phase error; and
   e) calibrating the SSB receiver by using that one of the first and second phase shift values that has yielded the smaller one of the first and second phase errors.

2. The method according to claim 1, wherein the first and second phase errors are calculated each as $$E_{\varphi,j} = |\Delta\varphi_{12} - \Delta\varphi_{23}|$$

with
   $E_{\varphi,j}$ corresponding to the respective first (j=1) and second (j=2) phase error,
   $\Delta\varphi_{12}$, $\Delta\varphi_{23}$ corresponding to the first and second phase differences, respectively, and
   $|\cdot|$ denoting the absolute value.

3. The method according to claim 1, wherein the predetermined phase offset is in the range of 10° to 80°.

4. The method according to claim 1, wherein the predetermined phase offset is in the range of 25° to 65°.

5. The method according to claim 1, wherein the predetermined phase offset is approximately 45°.

6. The method according to claim 1, wherein the phase shifter comprises, in one of the inphase and quadrature paths, a filter with at least one variable capacitor or inductor.

7. The method according to claim 6, wherein the filter comprises a capacitor bank having parallel capacitors that can be selectively connected to said one path to adjust the phase shift.

8. The method according to claim 7, wherein capacitances of the capacitors of said capacitor bank form a geometric sequence with a common ratio of two.

9. The method according to claim 6, wherein the phase shifter comprises another filter in the other one of said paths.

10. The method according to claim 1, wherein the SSB receiver further comprises an amplitude adjuster for mutually adjusting the amplitudes of the I- and Q-signals by an adjustable amplitude gain,
   wherein, in step a) and its repetition in step d), also the amplitude gain is adjusted to a first amplitude gain value and a second amplitude gain value, respectively, and in step e) the SSB receiver is calibrated by using that combination of the first phase shift and the first amplitude gain value and the second phase shift and the second amplitude gain value that has yielded the smaller one of the first and second phase errors.

11. The method according to claim 10, wherein the amplitude adjuster comprises a resistor bank having parallel resistors that can be selectively connected to one of the inphase and quadrature paths to adjust the amplitude gain.

12. The method according to claim 11, wherein resistances of the resistors of said resistor bank form a geometric sequence with a common ratio of two.

13. The method according to claim 11, wherein the resistor bank further has a respective capacitor in series to each selectively connectable resistor.

14. The method according to claim 1, wherein the first, second, and third test signals are generated by amplitude modulation.

* * * * *